US012718887B2

(12) United States Patent
Xiang et al.

(10) Patent No.: US 12,718,887 B2
(45) Date of Patent: Aug. 25, 2026

(54) OPERATION METHODS OF MEMORY, MEMORY AND MEMORY SYSTEMS

(71) Applicant: Yangtze Memory Technologies Co., Ltd., Wuhan (CN)

(72) Inventors: Li Xiang, Wuhan (CN); Wei Huang, Wuhan (CN); Mehui Lai, Wuhan (CN); Jianjie Li, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 165 days.

(21) Appl. No.: 18/422,919

(22) Filed: Jan. 25, 2024

(65) Prior Publication Data

US 2025/0166710 A1 May 22, 2025

(30) Foreign Application Priority Data

Nov. 20, 2023 (CN) ........................ 202311564296.5

(51) Int. Cl.
*G11C 16/26* (2006.01)
*G11C 16/04* (2006.01)
*G11C 16/08* (2006.01)

(52) U.S. Cl.
CPC .......... *G11C 16/26* (2013.01); *G11C 16/0433* (2013.01); *G11C 16/08* (2013.01)

(58) Field of Classification Search
CPC ..... G11C 16/26; G11C 16/0433; G11C 16/08; G11C 16/0483; G11C 16/30; G11C 16/24
See application file for complete search history.

(56) References Cited

U.S. PATENT DOCUMENTS 10,734,077 B1 * 8/2020 Kamae .................. G11C 16/32
2008/0244162 A1 * 10/2008 Mokhlesi ........... G11C 16/0483 711/103
2008/0250300 A1 * 10/2008 Mokhlesi ............... G06F 12/00 714/780
2015/0318045 A1 * 11/2015 Yun ........................ G11C 16/30 365/185.25
2020/0135271 A1 * 4/2020 Kamata .................. H10B 43/27
2022/0130467 A1 * 4/2022 Yu ...................... G11C 16/0483
2022/0383961 A1 * 12/2022 Lien ....................... G11C 16/08
2024/0079065 A1 * 3/2024 Shiino .................... G11C 16/10
2024/0221836 A1 * 7/2024 Lee .................... G11C 11/5671

* cited by examiner

*Primary Examiner* — Jay W. Radke
(74) *Attorney, Agent, or Firm* — Hanley, Flight & Zimmerman, LLC

(57) ABSTRACT

The present application provides an operation method of a memory, a memory, and a memory system, and relates to the technical field of semiconductor chips. The memory includes a memory block and a plurality of word lines coupled to the memory block. The operation method includes: applying a pass voltage to the plurality of word lines after a first read operation and before a second read operation; applying the pass voltage to the plurality of word lines in a pre-turn-on stage of the second read operation; and applying a first read voltage to a first word line of the plurality of word lines in a read stage of the second read operation, wherein the pass voltage is greater than the first read voltage. In the present application, the pass voltage is applied to the plurality of word lines after the first read operation and before the second read operation.

18 Claims, 14 Drawing Sheets

OPERATION METHODS OF MEMORY, MEMORY AND MEMORY SYSTEMS

CROSS-REFERENCE TO RELATED APPLICATIONS

The present application claims the benefit of priority to China Application No. 202311564296.5, filed on Nov. 20, 2023, the content of which is incorporated herein by reference in its entirety.

TECHNICAL FIELD

The present application is in the technical field of semiconductor chips, and in particular, operation methods of a memory, a memory and a memory system.

BACKGROUND

A flash is a memory having the characteristics of data non-volatility, fast read and write speed, low power consumption, long service life, and the like, and is widely applied in various electronic products, such as a mobile phone, a computer, a smart sensor, a positioning apparatus, etc.

BRIEF DESCRIPTION OF THE DRAWINGS

In order to illustrate the technical solution in the present application more clearly, the drawings to be used in some examples of the present application will be briefly introduced below. Apparently, the drawings in the following description are only drawings of some examples of the present application. Those of ordinary skills in the art may also obtain other drawings according to these drawings. In addition, the drawings in the following description may be regarded as schematic diagrams, instead of limitations on the actual size of product, flow of method, timing of signal, etc. involved in the examples of the present application.

Figure 1:
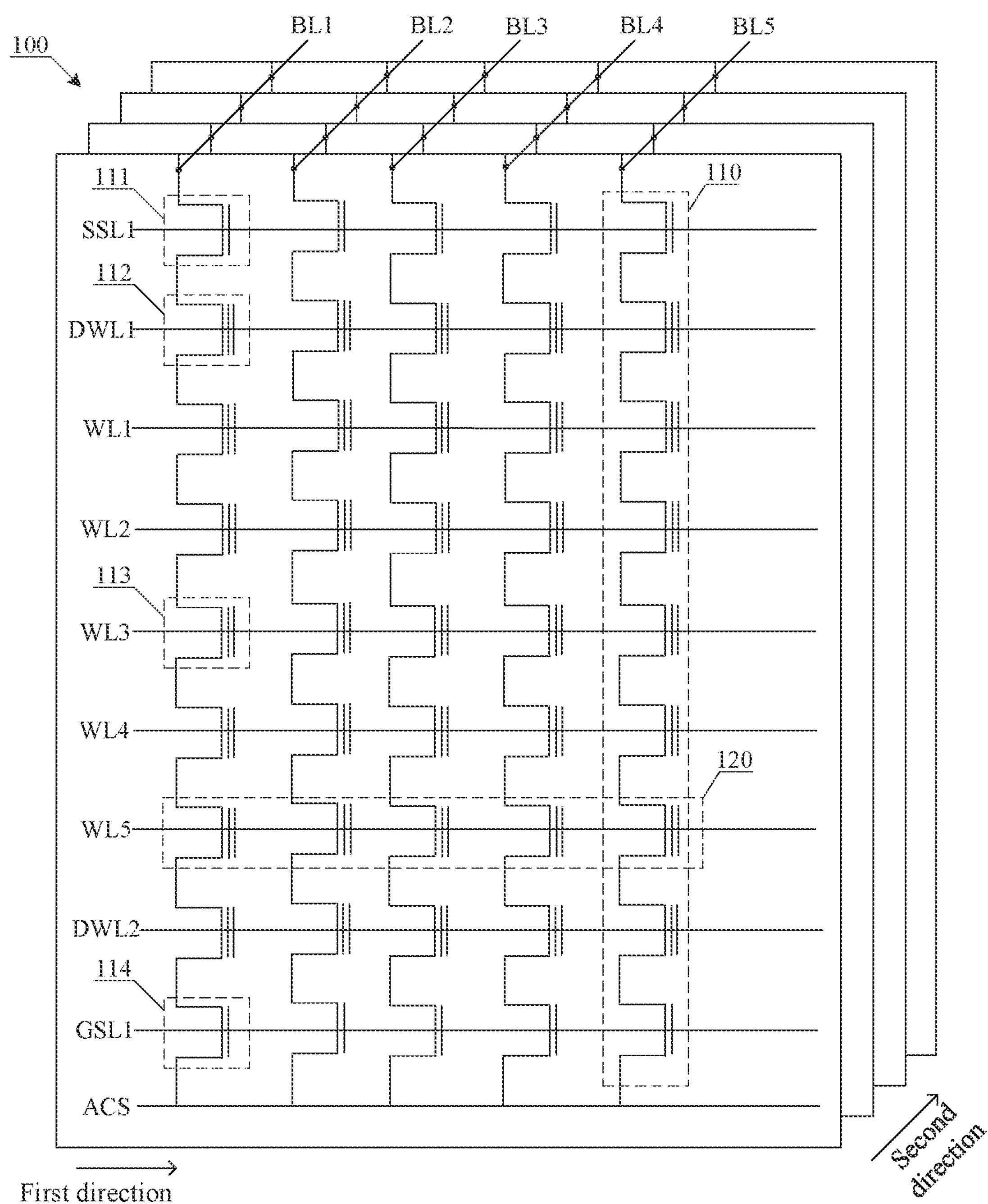
FIG. 1 is a schematic structural diagram of a memory block provided by examples of the present application.

Reference numerals: Memory block 100; Memory string 110; Top select gate 111; Dummy memory cell 112; Memory cell 113; Bottom select gate 114; Physical page 120; Memory stack layer 210; Gate conductive layer 211; Dielectric layer 212; Substrate 220; String select line 230; Word line 240; Ground select line 250; Memory system 300; Memory controller 310; Memory 320; Peripheral circuit 400; I/O interface 410; Control logic 420; Row decoder 430; Voltage generator 440; Page buffer 450; Column decoder 460; Data bus 470; Register 480; Memory array 500.

DETAILED DESCRIPTION

The technical solutions in some examples of the present application will be described below clearly and completely in conjunction with the FIGS. 1-14. Apparently, the examples described are only part of, but not all of, the examples of the present application. All other examples obtained by those of ordinary skill in the art based on the examples provided by the present application shall fall in the scope of protection of the present application.

Unless otherwise specified in the context, throughout the specification and the claims, the term "comprise" is interpreted as an open and inclusive meaning, i.e., "including, but not limited to". In the description of the specification, the terms "one implementation", "some implementations", "example implementation", "exemplarily" or "some examples", etc. are intended to indicate that particular features, structures, materials, or characteristics related to the example are included in at least one example of the present application. The schematic representation of the above terms may not necessarily refer to the same implementation or example. Furthermore, these particular features, structures, materials, or characteristics may be included in any of one or more implementations or examples in any suitable manner.

In the following, the terms "first" and "second" are only for the purpose of description, and cannot be construed as indicating or implying relative importance or implicitly indicating the number of indicated technical features. Thus, features defined by "first" and "second" may explicitly or implicitly include one or more of such features. In the description of the examples of the present application, "a plurality of" means two or more, unless otherwise stated.

In describing some examples, expressions of "coupled" and derivatives thereof may be used. For example, the term "coupled" may be used in the description of some examples to indicate that two or more components have a direct physical contact or an electrical contact. In this case, "coupled" may be also described as "connected". Moreover, the term "coupled" may also mean that two or more components have no direct contact with each other, but still cooperate or interact with each other. The examples disclosed herein are not necessarily limited to the content herein.

The use of "configured to" herein means open and inclusive language, and does not exclude an apparatus suitable for performing or configured to perform additional tasks or steps.

A flash is a non-volatile memory (memory device) that can be electrically erased and reprogrammed, and can store data even if power supply is removed. The flash may comprise both an NOR architecture and a NAND architecture. A further illustration is made in the present application by taking a NAND flash as an example. With the increasing requirements of consumers for the performance and reliability of the electronic products, the market puts forward higher requirements for the read speed, write (that may be also called program) speed, service life and the like of the flash (memory).

A memory array of a three-dimensional (3D) NAND flash may comprise a plurality of memory blocks. As shown in FIG. 1, the memory block 100 may comprise a plurality of memory strings 110, wherein each memory string 110 may comprise a top select gate (TSG) 111, a plurality of memory cells 113, a dummy (DMY) memory cell 112 and a bottom select gate (BST) 114 that are stacked in series sequentially. In the examples of the present application, the memory cell 113 may be a device capable of storing charges, such as a floating gate transistor or a charge trap field effect transistor, etc.

As shown in FIG. 1, M memory strings 110 may be arranged in a row along a first direction, N rows of memory strings 110 may be arranged as the memory block 100 along a second direction perpendicular to the first direction, for example, M=5, and N=4. In some examples, among the M memory strings 110 of the same row, a gate of the top select gate 111 of each memory string 110 may be coupled to the same string select line (SSL). That is to say, a row of memory strings 110 may be selected through the string select line. A gate of the bottom select gate 114 in each memory string 110 may be coupled to the same ground select line (GSL).

The M memory strings 110 of the same row may be coupled with M bit lines (BL) in one-to-one correspondence, for example, a drain of the top select gate 111 in the memory string 110 is coupled with the bit line. In order to reduce the number of the bit lines, M*N memory strings 110 in the N rows of memory cells 113 may share M bit lines; that is to say, any memory string 110 and the memory strings 110 of other (N−1) rows in corresponding positions may be coupled to the same bit line.

For the N*M memory strings 110 in the memory block 100, a control gate of the memory cell 113 in any memory string 110 and control gates of the memory cells 113 in other (N*M−1) memory strings 110 in corresponding positions may be coupled to the same word line (WL). And, a control gate of the dummy memory cell 112 in any memory string 110 and control gates of the dummy memory cells 112 in other (N*M−1) memory strings 110 in corresponding positions may be coupled to the same dummy word line (DWL). Sources of the bottom select gates 114 in the N*M memory strings 110 may be coupled to a common source line (CSL), which may be also called an array common source (ACS).

In the M memory strings 110 of the same row, the memory cells 113 coupled to the same word line may be called one physical page 120; that is to say, one physical page 120 may be selected through the string select line and the word line.

It is to be noted that the drawings of the present application only show a structure of the memory block 100 of some examples, but in practice, the structure of the memory block 100 may be also of other forms.

Figure 2:
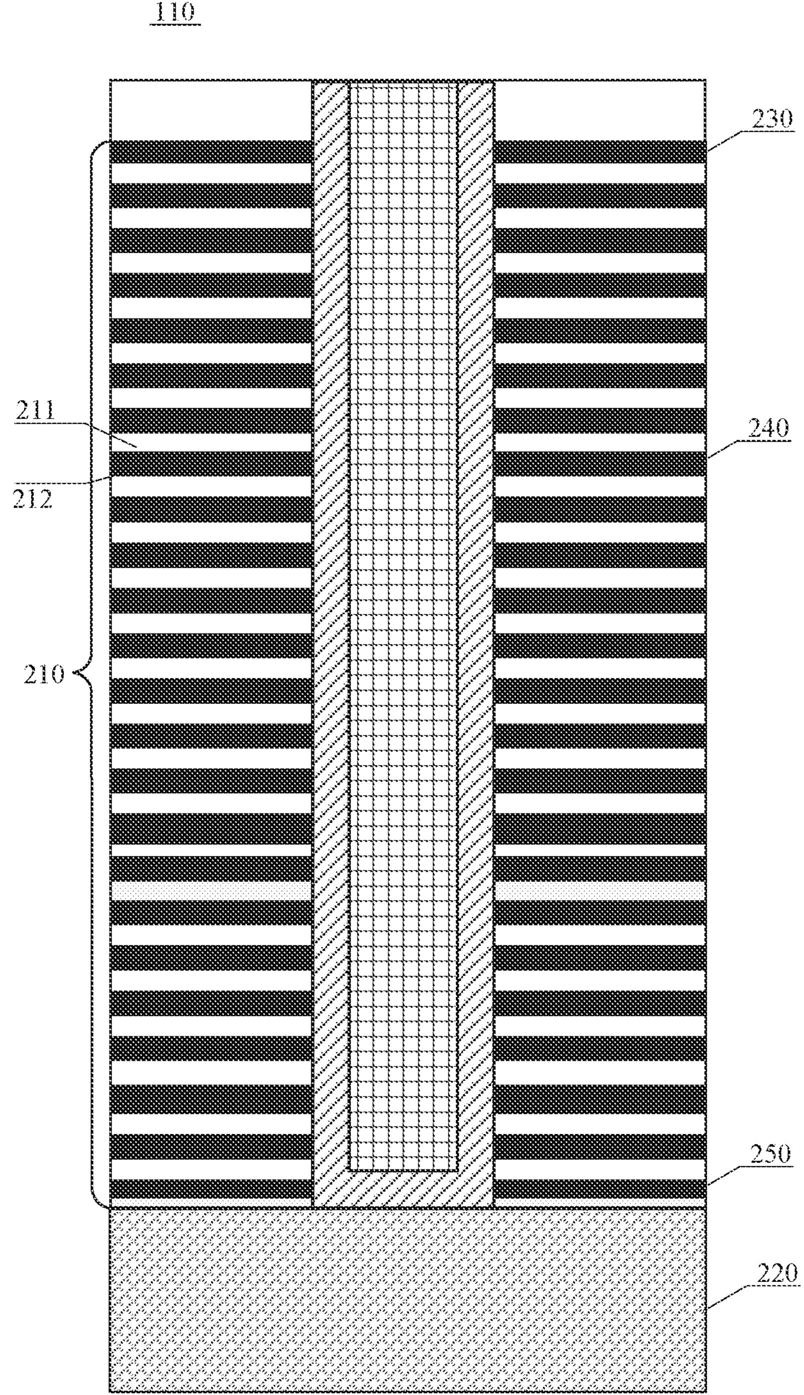
FIG. 2 is a partial schematic cross-sectional view of a memory string provided by examples of the present application.

FIG. 2 is a partial schematic cross-sectional view of a possible memory string of the present application. The memory string 110 may vertically extend through a memory stack layer 210 above a substrate 220. The substrate 220 may comprise silicon (e.g., single crystalline silicon), silicon germanium (SiGe), gallium arsenide (GaAs), germanium (Ge), silicon on insulator (SOI), germanium on insulator (GOI), or any other suitable materials.

The memory stack layer 210 may comprise alternate gate conductive layers 211 and dielectric layers 212. The number of the gate conductive layers 211 and the dielectric layers 212 in the memory stack layer 210 may determine the number of the memory cells 113 in the memory string 110.

The gate conductive layer 211 may comprise a conductive material, including, but not limited to, tungsten (W), cobalt (Co), copper (Cu), aluminum (Al), polysilicon, doped silicon, silicide, or any combination thereof. In some implementations, each gate conductive layer 211 comprises a metal layer, e.g., a tungsten layer. In some implementations, each gate conductive layer 211 comprises a doped polysilicon layer. Each gate conductive layer 211 may comprise a control gate surrounding the memory cell 113, and the gate conductive layer 211 at top of the memory stack layer 210 may laterally extend as a string select line 230, the gate conductive layer 211 at bottom of the memory stack layer 210 may laterally extend as a ground select line 250, or the gate conductive layer 211 between the string select line 230 and the ground select line 250 may laterally extend as a word line 240.

It is to be understood that, although not shown in FIG. 2, additional components of the memory string 110 may be formed, and include, but are not limited to, a gate line slit/source contact, a local contact, an interconnect layer, etc.

A memory page is the smallest unit of reading/writing in the memory block 100, and each physical page 120 may comprise at least one memory page (logical page). A read operation is performed on the memory page, that is, a threshold voltage Vt of all the memory cells 113 in the memory page is measured. Since it is not easy to achieve direct measurement of the threshold voltage Vt of the memory cell 113, and output current of the memory cell 113 is related to a gate voltage and the threshold voltage Vt, the threshold voltage Vt of the memory cell 113 is determined by measuring the current.

Figure 3:
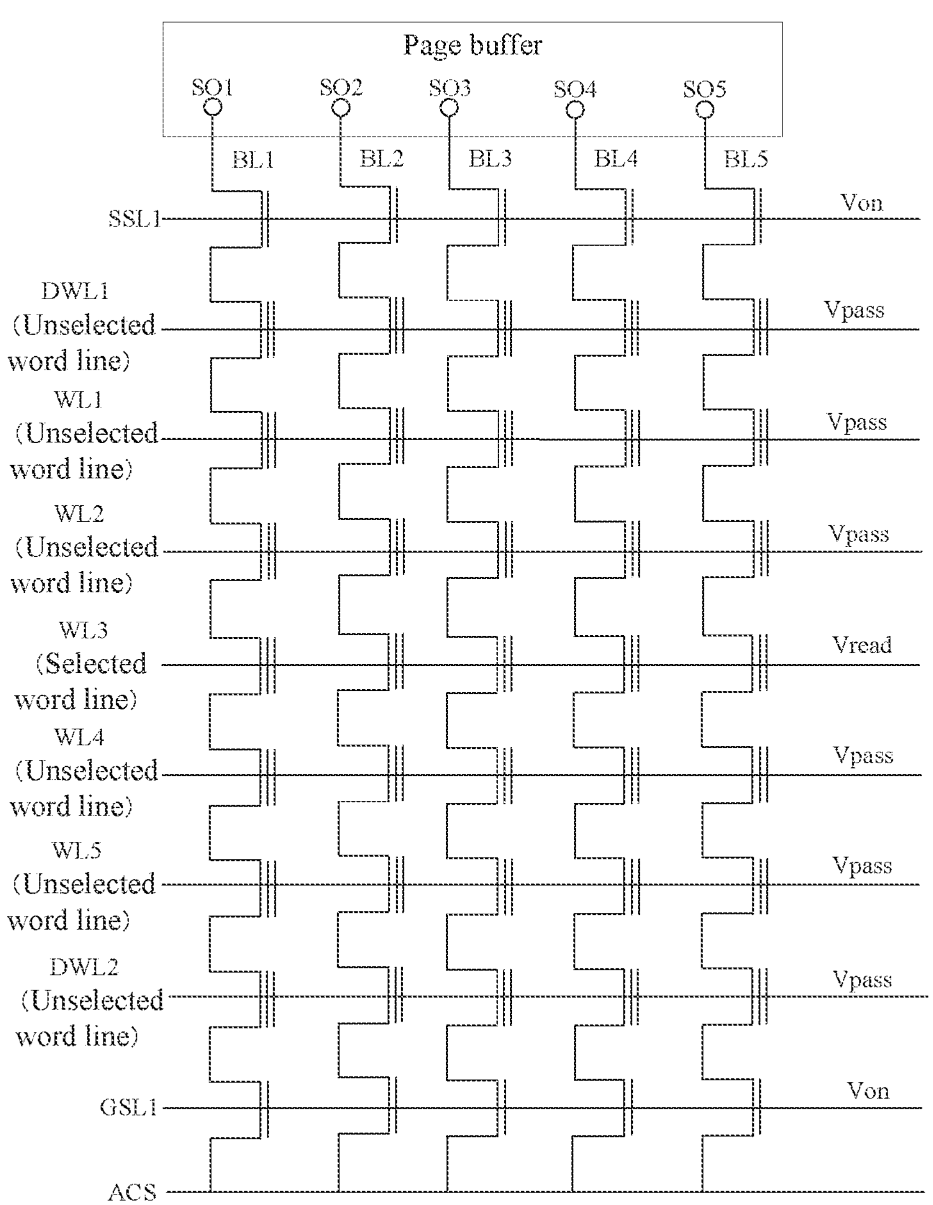
FIG. 3 is a schematic diagram of voltage waveform applied by a read operation to word lines and select lines provided by examples of the present application.

As shown in FIG. 3, in the read stage of each read operation, a turn-on voltage Von is applied to the string select line (such as SSL1) and the ground select line (such as GSL1) coupled with the memory string where the memory cell to be read is located, a read voltage Vread is applied to a selected word line (such as WL3) coupled with the memory cell to be read, and a pass voltage Vpass is applied to unselected word lines (such as WL1, WL2) other than the selected word line, and the dummy word line (such as DWL1). Therefore, a bit line coupled with the memory string where the memory cell to be read is located and a sensing node (SO) in a corresponding page buffer are discharged.

Figure 4:
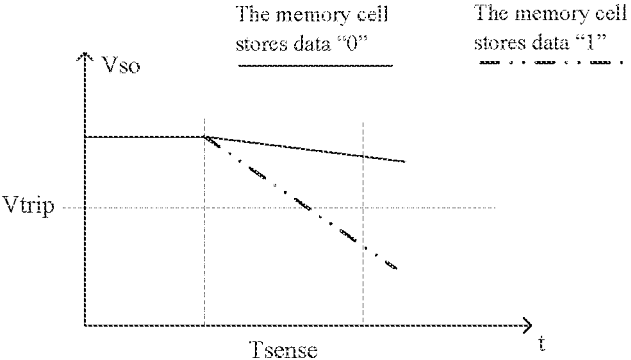
FIG. 4 is a schematic diagram of read result judgment by a read operation provided by examples of the present application.

As shown in FIG. 4, after a sensing duration Tsense, data stored by the memory cell is obtained by comparing magnitudes of a voltage Vso of the sensing node and a trip voltage Vtrip. In an example, if the threshold voltage Vt is greater than the read voltage Vread, a discharging rate of the sensing node is low (which may be also referred to as that a discharging current is small). After the sensing duration Tsense, the voltage Vso of the sensing node is greater than the trip voltage Vtrip, thus data "0" is read from the memory cell to be read. Likewise, if the threshold voltage Vt is less than the read voltage Vread, a discharging rate of the sensing node is high (which may be also referred to as that the discharging current is large). After the sensing duration Tsense, the voltage Vso of the sensing node is less than the trip voltage Vtrip, thus data "1" is read from the memory cell to be read.

Figure 5:
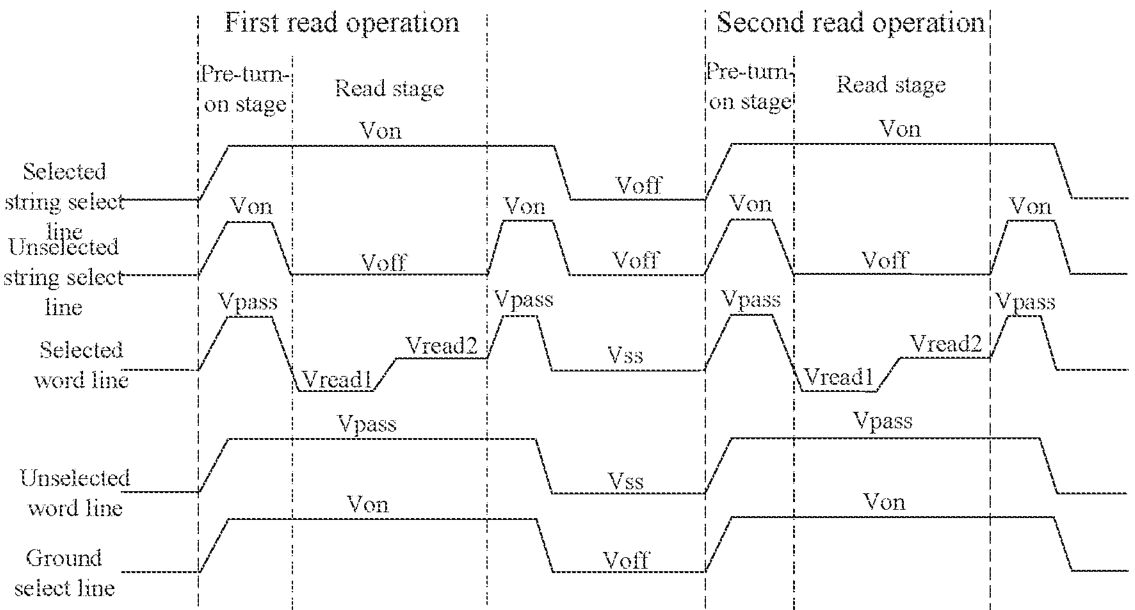
FIG. 5 is a schematic diagram of voltage waveform of word lines and select lines of a read operation provided by examples of the present application.

As shown in FIG. 5, a pre-turn-on stage is further included before the read stage of each read operation. In the pre-turn-on stage, the pass voltage Vpass is applied to the plurality of word lines of the memory block, such that the memory cells coupled with the plurality of word lines are turned on, and the turn-on voltage Von is applied to the plurality of string select lines and/or ground select lines of the memory block, such that the corresponding string select lines and/or ground select lines are turned on, thereby turning on a channel of the memory string.

After the first read operation ends, the turn-on voltage Von is applied to the string select line and/or ground select line of the memory string. At the same time, the pass voltage Vpass is applied to the word line of the memory string, such that the channel of the memory string may be turned on with the bit line and the array common source so as to pull out or neutralize charges in the channel of the memory string, thereby achieving channel reset of the memory string. Thereafter, the string select line, the ground select line and the word line of the memory string are discharged so as to facilitate subsequent read operations (such as a second read operation).

In a pre-turn-on stage of the second read operation, the pass voltage Vpass is further applied to the plurality of word lines, and the turn-on voltage Von is applied to the plurality of string select lines to charge the word lines and the string select lines.

As the number of layers of the memory stack layer 210 is increasingly larger, a size of the memory block 100 in the 3D NAND is increasingly larger, and the number of the word lines 240 coupled with the memory block 100 is also more and more. Therefore, during the read operation on the memory block 100, power consumption required for charging the selected word line and the unselected word lines is increasingly larger. In view of the supply power of the memory 320, it is often necessary to meet the power requirement at the cost of the read time of the read operation. That is, in the case of limited supply power, longer charging time may be employed to charge the selected word lines and the unselected word lines, resulting in a longer read time of the read operation.

In the examples of the present application, after the first read operation and before the second read operation, the pass voltage is applied to the plurality of word lines of the memory block; that is to say, the word lines are not discharged between two adjacent read operations in the present application. Therefore, during the second read operation, only the string select line, instead of the word line, needs to be charged. In the case of the limited supply power, only the string select line, instead of the word line, is charged, which can make the voltage of the string select line reach the turn-on voltage quickly, such that the charging time of the pre-turn-on stage of the second read operation is saved, and the read time of the second read operation is shortened, thereby increasing the read speed of the memory. In addition, in the present application, between the two adjacent read operations, the application of the turn-on voltage to the ground select line may be also maintained (i.e., the ground select line is not discharged). Therefore, the channel of the memory string may keep turned on through the bottom select gate and the array common source. In some implementations, the array common source is grounded (or coupled to a fixed low-potential node Vss), such that the array common source can pull down a channel potential of the memory string to 0 V (or Vss) to reset the channel of the memory string to a better state (i.e., to better pull out or neutralize the charges in the channel of the memory string). Further, the time of a pre-turn-on stage of a next read operation can be shortened to further shorten the read time of the read operation.

Figure 6:
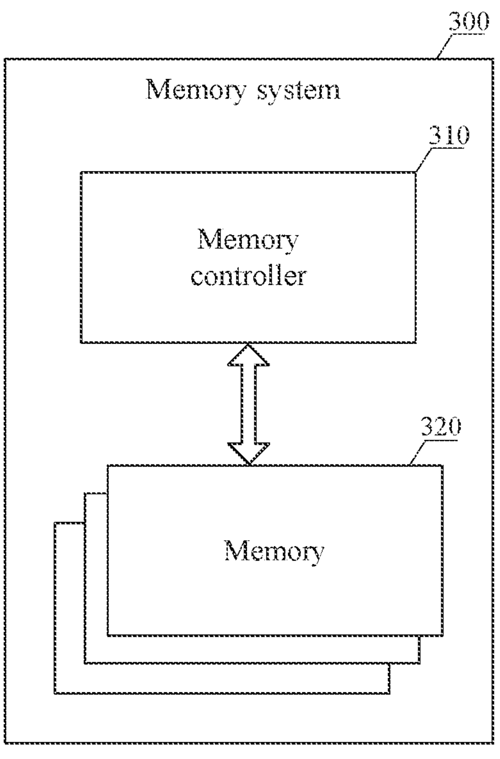
FIG. 6 is a schematic structural diagram of a memory system provided by examples of the present application.

As shown in FIG. 6, examples of the present application provide a memory system 300 that comprises a memory controller 310 and a memory 320, wherein the memory controller 310 is configured to control a data storage operation of the memory 320. The memory system 300 may be applied to and packaged into different types of electronic apparatuses, for example, a mobile phone (e.g. a cellphone), a desktop computer, a tablet computer, a notebook computer, a vehicle apparatus, a gaming console, a printer, a positioning apparatus, a wearable apparatus, a smart sensor, a mobile power supply, a virtual reality (VR) apparatus, an augmented reality (AR) apparatus, and a server, or any other electronic apparatuses capable of storing data.

Of course, the memory controller 310 may also perform any other suitable functions, such as formatting the memory 320. For example, the memory controller 310 may communicate with an external apparatus (e.g., a host) through at least one of various interface protocols. The interface protocol may include at least one of a Universal Serial Bus (USB) protocol, a Multi Media Card (MMC) protocol, a Peripheral Component Interconnect (PCI) protocol, a PCI-Express (PCI-E) protocol, an Advanced Technology Attachment (ATA) protocol, a serial ATA protocol, a parallel ATA protocol, a Small Computer System Interface (SCSI), an Enhanced Small Disk Interface (ESDI) protocol and an Integrated Drive Electronics (IDE) protocol.

Figure 7:
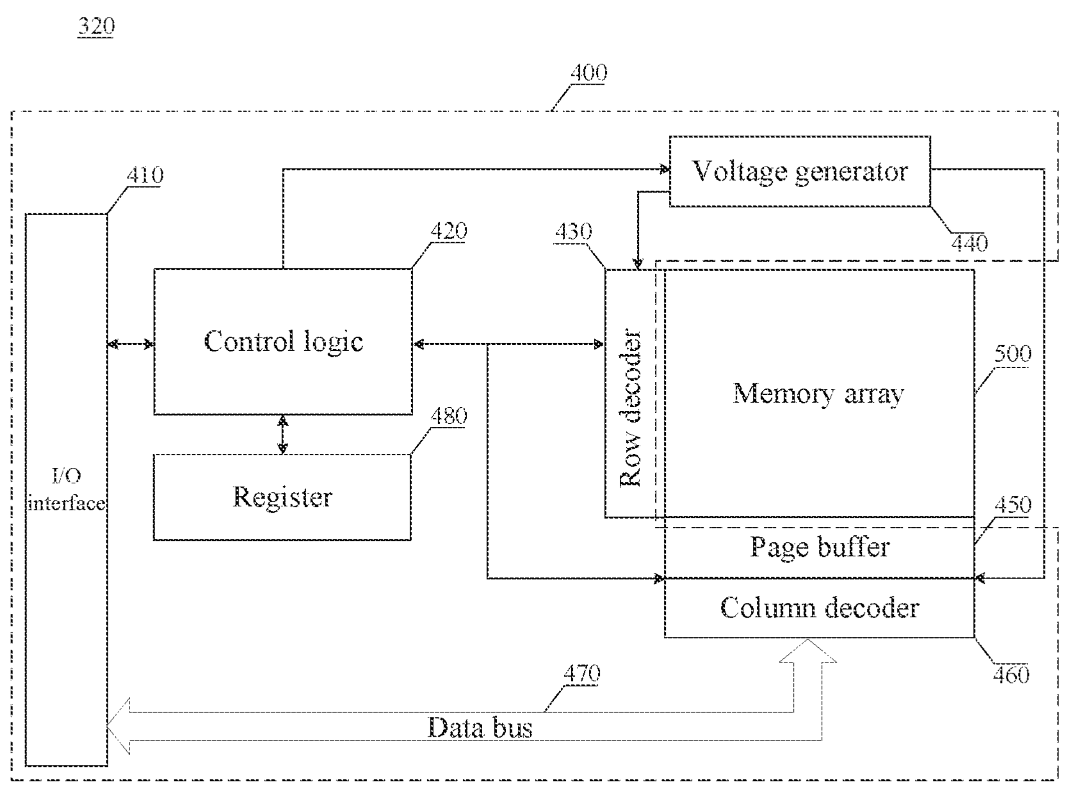
FIG. 7 is a schematic structural diagram of a memory and a peripheral circuit provided by examples of the present application.

In an example, as shown in FIG. 7, the above-mentioned memory 320 may comprise a memory array 500 and a peripheral circuit 400, wherein the memory array 500 is coupled to the peripheral circuit 400. The peripheral circuit 400 is used to control the memory array 500, wherein the memory array 500 may comprise a plurality of memory blocks 100 as shown in FIG. 1.

The peripheral circuit 400 comprises an I/O interface 410, a control logic 420, a row decoder 430, a voltage generator 440, a page buffer 450, a column decoder 460, a data bus 470 and a register 480. It is to be understood that, in some examples, additional circuits not shown in FIG. 7 may be also included.

The I/O interface 410 may be coupled to the control logic 420, and act as a control buffer to buffer and relay control commands received from the memory controller 310 (e.g., the memory controller 310 in FIG. 6) to the control logic 420 and state information received from the control logic 420 to a host. The I/O interface 410 may be also coupled to the page buffer 450 via the data bus 470 and act as a data interface and a data buffer to buffer and relay the data to and from the memory array 500.

The control logic 420 may be coupled to the voltage generator 440, the page buffer 450, the column decoder 460, the row decoder 430 and the I/O interface 410, etc., and configured to control operations of the peripheral circuit 400. The control logic 420 may generate an operation signal to control operations of the row decoder 430, the column decoder 460, the page buffer 450 and the voltage generator 440 in response to a command (CMD) or a control signal from the memory controller 310, wherein the command may be a program command, read command, etc.

The row decoder 430 may supply a voltage generated by the voltage generator 440 to a selected word line and an unselected word line of the memory array 500 in response to control of the control logic 420. As described in detail below, the row decoder 430 is configured to perform program operation on memory cells coupled to one or more selected word lines in the memory array 500.

The voltage generator 440 may use an external supply voltage or an internal supply voltage to generate various voltages, for example, a program voltage Vpgm, a pass voltage Vpass, a read voltage Vread and a verify voltage Vvfy, etc., or a combination thereof applied to the word line 240, for performing operations such as erase, program, read and verify, etc. on the memory array 500.

The column decoder 460 may select one or more memory strings 110 in the memory array 500 in response to the control of the control logic 420 and by applying a bit line voltage generated from the voltage generator 440.

The page buffer 450 may read and program (write) data from and to the memory array 500 according to control signals from the control logic 420. In one example, the page buffer 450 may store program data (write data) to be programmed into the memory array 500. In another example, the page buffer 450 may perform a program verification operation to ensure that the data has been properly programmed into the memory cell 113 coupled to the selected word line. In yet another example, the page buffer 450 may also detect a small voltage signal from a bit line that represents a data bit stored in a memory cell 113 and amplify the small voltage signal to a recognizable voltage signal in a read operation.

The register 480 may be coupled to the control logic 420 and includes a state register, a command register and an address register for storing state information, command operation codes (OP codes), and command addresses for controlling the operations of each peripheral circuit 400.

It should be understood that by those skilled in the art that the operations performed by the row decoder 430, the page buffer 450, the control logic 420 and the voltage generator 440 as described in the present application may be performed by a processing circuit. The processing circuit may include, but is not limited to, a hardware of a logic circuit, or a combination of a hardware of a processor executing a software and the software.

In the implementations of the present application, the peripheral circuit 400 performs a read operation on the memory block 100 after receiving a read instruction, for example, receiving a sequential block cache read command. When the peripheral circuit 400 performs the read operation, the control logic 420 controls the row decoder 430 to apply a voltage to the word line 240 of the memory block 100 (for example, applying a read voltage to the selected word line, and applying a pass voltage to the unselected word line). Moreover, between two adjacent read operations, in the present application, the application of the pass voltage to the word line 240 is maintained; that is to say, in the present application, the word line 240 is not discharged between the two adjacent read operations. Therefore, the time for charging the word line 240 by the second read operation and the subsequent read operations is shortened so as to shorten the read time of the read operation.

Further, in the present application, between the two adjacent read operations, the application of the turn-on voltage to the ground select line may be also maintained; that is to say, the ground select line is not discharged between the two adjacent read operations in the present application. Therefore, the channel of the memory string 110 can achieve better discharge restoring; and further, the time of a pre-turn-on stage of a next read operation can be shortened so as to further shorten the read time of the read operation.

As described above, the peripheral circuit 400 may apply the turn-on voltage to the string select line 230 and apply the read voltage to the word line 240 so as to select one physical page 120 of the memory block 100. The peripheral circuit 400 may apply different read voltages to the word line 240 so as to select to perform the read operation on the memory page in the physical page 120. The present application is illustrated by taking the peripheral circuit 400 continuously performing two read operations (i.e., the first read operation and the second read operation) as an example.

In some implementations, the first read operation and the second read operation apply the read voltage to different word lines 240 respectively, and apply the turn-on voltage to different string select lines 230. That is to say, in contrast to the first read operation, the second read operation switches the word line (that may be called a selected word line) to which the read voltage is applied in the read stage, and also switches the string select line (that may be called a selected string select line) to which the turn-on voltage is applied.

Figure 8:
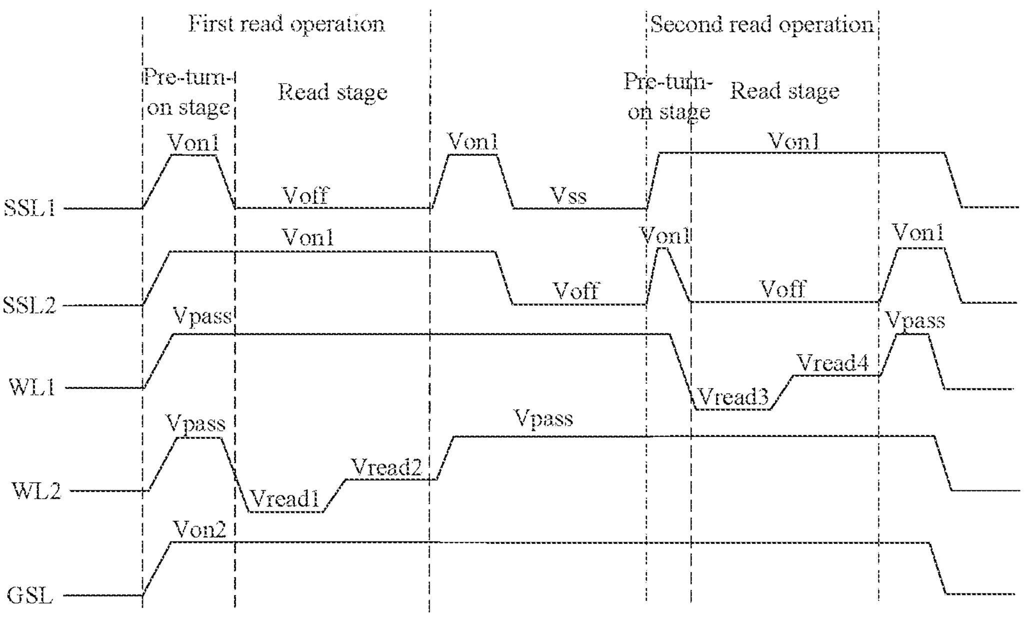
FIG. 8 is a schematic diagram of voltage waveform applied by a first optional read operation to word lines and select lines provided by examples of the present application.

In an example, as shown in FIG. 8, in the pre-turn-on stage of the first read operation, through the row decoder 430, the pass voltage Vpass is applied to the plurality of word lines (e.g., the word line WL1 and the word line WL2) coupled with the memory block 100, a first turn-on voltage Von1 is applied to the plurality of string select lines (e.g., the string select line SSL1 and the string select line SSL2) coupled with the memory block 100, and a second turn-on voltage Von2 is applied to the ground select line GSL coupled with the memory block 100. Therefore, the top select gate 111, the plurality of memory cells 113 and the bottom select gate 114 of the memory block are turned on, and hot carriers in the channel of the memory string 110 may be removed through the array common source.

When a turn-off voltage Voff is applied to string select lines (i.e., the string select line SSL1) of the plurality of string select lines other than the second string select line (e.g., the string select line SSL2) through the row decoder 430, the pre-turn-on stage of the first read operation ends, and it enters the read stage of the first read operation. In the read stage of the first read operation, through the row decoder 430, application of the first turn-on voltage Von1 to the string select line SSL2, application of the second turn-on voltage Von2 to the ground select line GSL, and application of the turn-off voltage Voff to the string select line SSL1 are maintained. At the same time, a second read voltage is applied to a second word line (e.g., the word line WL2) through the row decoder 430. In some examples, the second read voltage may include two different voltages (e.g., Vread1 and Vread2), and the pass voltage Vpass is applied to word lines (e.g., the word line WL1) of the plurality of word lines other than the second word line, wherein the pass voltage Vpass is greater than the second read voltage (i.e., Vpass>Vread1, Vpass>Vread2). Therefore, the memory cells coupled with the word line WL1 can be saturated and turned on, and a discharging rate of the sensing node is only related to the memory cell coupled with the word line WL2. As described above, if the threshold voltage Vt of the memory cell coupled with the word line WL2 is not less than the second read voltage, the discharging rate of the sensing node is low, such that after the sensing duration Tsense, the voltage Vso of the sensing node is greater than the trip voltage Vtrip, and data "0" is read. If the threshold voltage Vt of the memory cell coupled with the word line WL2 is less than the second read voltage, the discharging rate of the sensing node is high, such that after the sensing duration Tsense, the voltage Vso of the sensing node is less than the trip voltage Vtrip, and data "1" is read.

After the read stage of the first read operation, and before the pre-turn-on stage of the second read operation, through the row decoder 430, first, the first turn-on voltage Von1 is applied to the string select line SSL1 and the string select line SSL2, the second turn-on voltage Von2 is applied to the ground select line GSL, and the pass voltage Vpass is applied to the word line WL1 and the word line WL2, thereby turning on the memory cells, the top select gate and the bottom select gate, such that the charges in the channel of the memory string are released from two ends of the channel to reduce residual charges in the channel so as to achieve channel reset of the memory string. After the channel reset (which may be also called a read restoring stage or a pre-turn-off stage), the turn-off voltage Voff may be applied to the string select line SSL1 and the string select line SSL2 through the row decoder 430 to turn off the top select gate in the memory string 110, thereby turning off the channel of the memory string 110.

In some implementations, when the turn-off voltage Voff is applied to the string select line SSL1 and the string select line SSL2 through the row decoder 430, application of the pass voltage Vpass to the word line WL1 and the word line WL2 through the row decoder 430 is maintained, the second turn-on voltage Von2 is applied to the ground select line GSL to turn on the memory cell and the bottom select gate in the memory string 110, and the array common source pulls down a channel potential of the memory string to 0 V (or Vss) to better pull out or neutralize the charges in the channel of the memory string, such that the channel of the memory string can be reset to a better state. Therefore, the time of the pre-turn-on stage of a next read operation can be shortened, such that the read time of the read operation is shortened.

In the pre-turn-on stage of the second read operation, through the row decoder 430, the pass voltage Vpass is applied to the word line WL1 and the word line WL2 coupled with the memory block 100, the first turn-on voltage Von1 is applied to the string select line SSL1 and the string select line SSL2 coupled with the memory block 100, and the second turn-on voltage Von2 is applied to the ground select line GSL. The potential of the word line WL1 and the word line WL2 has been charged to the pass voltage Vpass, and the potential of the ground select line GSL has been charged to the second turn-on voltage Von2 after the first read operation and before the second read operation. Therefore, in the pre-turn-on stage of the second read operation, the string select line SSL1 and the string select line SSL2 are only required to be selected to be charged through the row decoder 430, such that the time required for charging the string select line SSL1 and the string select line SSL2 to the first turn-on voltage Von1 is shortened significantly.

The first word line and the second word line are two different word lines, and the first string select line and the second string select line are two different string select lines. When the turn-off voltage Voff is applied to string select lines (i.e., the string select line SSL2) of the plurality of string select lines other than the first string select line (e.g., the string select line SSL1) through the row decoder 430, the pre-turn-on stage of the second read operation ends, and it enters the read stage of the second read operation. In the read stage of the second read operation, through the row decoder 430, application of the first turn-on voltage Von1 to the string select line SSL1, application of the second turn-on voltage Von2 to the ground select line GSL, and application of the turn-off voltage Voff to the string select line SSL2 are maintained. At the same time, the first read voltage is applied to the first word line (e.g., the word line WL1) through the row decoder 430. In some examples, the first read voltage may include two different voltages (e.g., Vread3 and Vread4), and the pass voltage Vpass is applied to word lines (e.g., the word line WL2) of the plurality of word lines other than the first word line. The pass voltage Vpass is greater than the first read voltage (i.e., Vpass>Vread3, Vpass>Vread4). Therefore, the memory cells coupled with the word line WL2 can be saturated and turned on, and the discharging rate of the sensing node is only related to the memory cell coupled with the word line WL1. Likewise, if the threshold voltage Vt of the memory cell coupled with the word line WL1 is not less than the first read voltage, the discharging rate of the sensing node is low, such that after the sensing duration Tsense, the voltage Vso of the sensing node is greater than the trip voltage Vtrip, and data "0" is read. When the threshold voltage Vt of the memory cell coupled with the word line WL1 is less than the first read voltage, the discharging rate of the sensing node is high, such that after the sensing duration Tsense, the voltage Vso of the sensing node is less than the trip voltage Vtrip, and data "1" is read.

In some implementations, the first word line and the second word line are the same word line, but the first string select line and the second string select line are two different string select lines. The first read operation and the second read operation apply the read voltage to the same word line 240, and apply the turn-on voltage to the different string select lines 230 respectively. That is to say, in contrast to the first read operation, the second read operation only switches the string select line (that may be called a selected string select line) to which the turn-on voltage is applied in the read stage.

Figure 9:
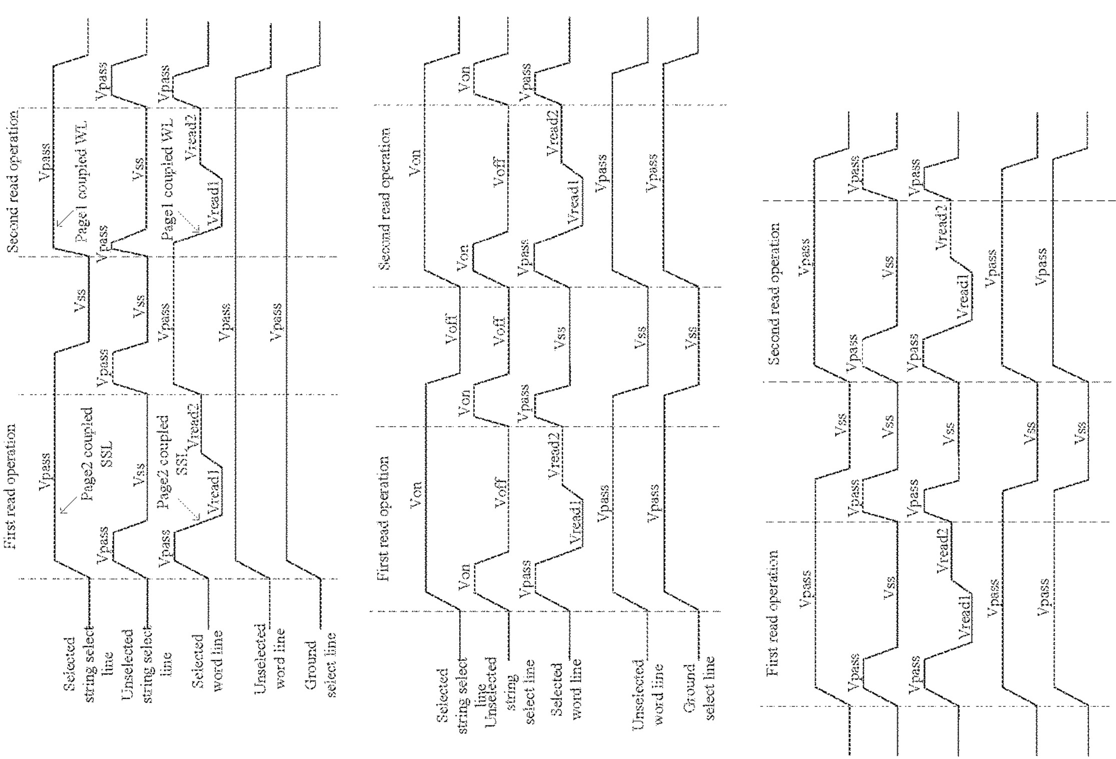
FIG. 9 is a schematic diagram of voltage waveform applied by a second optional read operation to word lines and select lines provided by examples of the present application.
Figure 9:
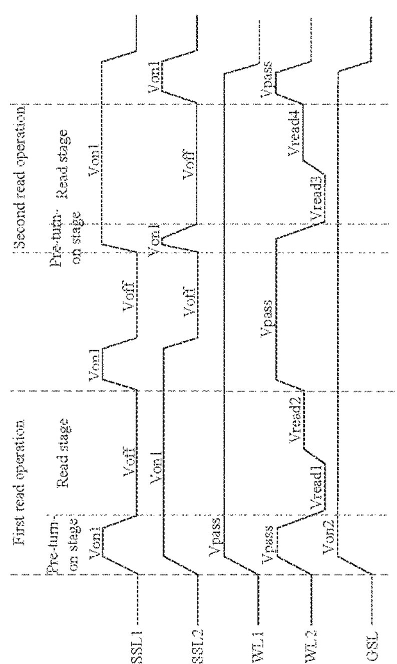

In an example, as shown in FIG. 9, in the read stage of the first read operation, through the row decoder 430, the second read voltage (e.g., Vread1 and Vread2) is applied to the second word line (e.g., the word line WL2), and the pass voltage Vpass is applied to word lines (e.g., the word line WL1) of the plurality of word lines other than the second word line; the first turn-on voltage Von1 is applied to the second string select line (e.g., the string select line SSL2), and the turn-off voltage Voff is applied to string select lines (e.g., the string select line SSL1) of the plurality of string select lines other than the second string select line.

In the read stage of the second read operation, through the row decoder 430, the first read voltage (e.g., Vread3 and Vread4) is applied to the first word line (e.g., the word line WL2), and the pass voltage Vpass is applied to word lines (e.g., the word line WL1) of the plurality of word lines other than the first word line; the first turn-on voltage Von1 is applied to the first string select line (e.g., the string select line SSL1), and the turn-off voltage Voff is applied to string select lines (e.g., the string select line SSL2) of the plurality of string select lines other than the first string select line.

In some implementations, the first string select line and the second string select line are the same string select line, but the first word line and the second word line are two different word lines. The first read operation and the second read operation apply the turn-on voltage to the string select line 230, and apply the read voltage to different word lines 240 respectively. That is to say, in contrast to the first read operation, the second read operation only switches the word line (that may be called as a selected word line) to which the read voltage is applied in the read stage.

Figure 10:
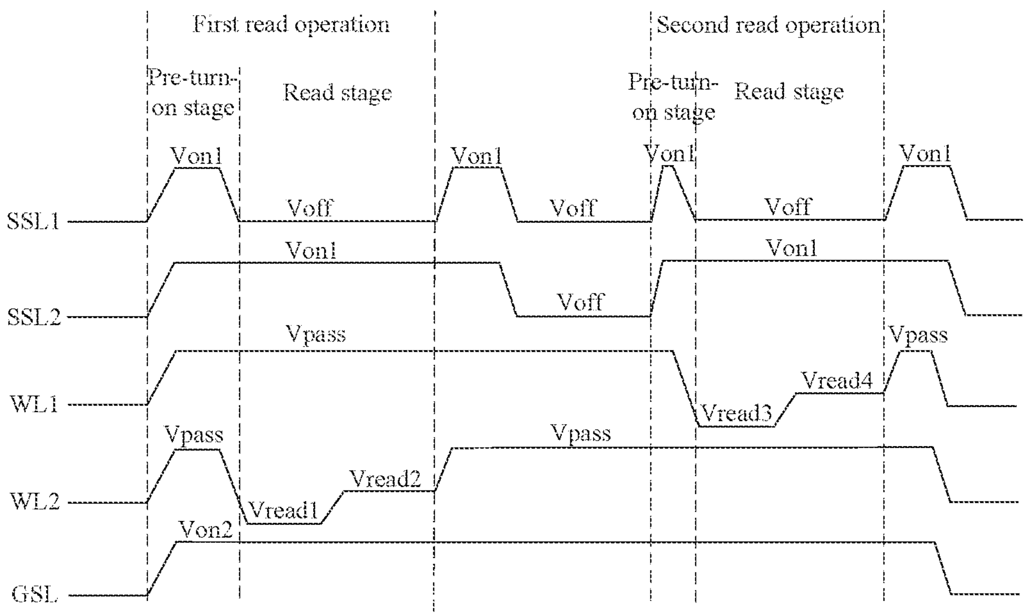
FIG. 10 is a schematic diagram of voltage waveform applied by a third optional read operation to word lines and select lines provided by examples of the present application.

In an example, as shown in FIG. 10, in the read stage of the first read operation, through the row decoder 430, the second read voltage (e.g., Vread1 and Vread2) is applied to the second word line (e.g., the word line WL2), and the pass voltage Vpass is applied to word lines (e.g., the word line WL1) of the plurality of word lines other than the second word line; the first turn-on voltage Von1 is applied to the second string select line (e.g., the string select line SSL2), and the turn-off voltage Voff is applied to string select lines (e.g., the string select line SSL1) of the plurality of string select lines other than the second string select line.

In the read stage of the second read operation, through the row decoder 430, the first read voltage (e.g., Vread3 and Vread4) is applied to the first word line (e.g., the word line WL1), and the pass voltage Vpass is applied to word lines (e.g., the word line WL2) of the plurality of word lines other than the first word line; the first turn-on voltage Von1 is applied to the first string select line (e.g., the string select line SSL2), and the turn-off voltage Voff is applied to string select lines (e.g., the string select line SSL1) of the plurality of string select lines other than the first string select line.

The read voltages applied to the word lines through the row decoder 430 may be the same. In some examples, in the read stage of the first read operation, the second read voltage (Vread1 and Vread2) is applied to the word line WL2, and in the read stage of the second read operation, the first read voltage (Vread3 and Vread4) is applied to the word line WL1, wherein Vread1 is equal to the Vread3, and Vread2 is equal to Vread4.

In some implementations, the first word line and the second word line are the same word line, and the first string select line and the second string select line are the same string select line. The first read operation and the second read operation apply the read voltage to the same word line 240, and apply the turn-on voltage to the same string select line 230. That is to say, in contrast to the first read operation, the second read operation neither switches the word line (that may be called a selected word line) to which the read voltage is applied in the read stage, nor switches the string select line (that may be called a selected string select line) to which the turn-on voltage is applied.

Figure 11:
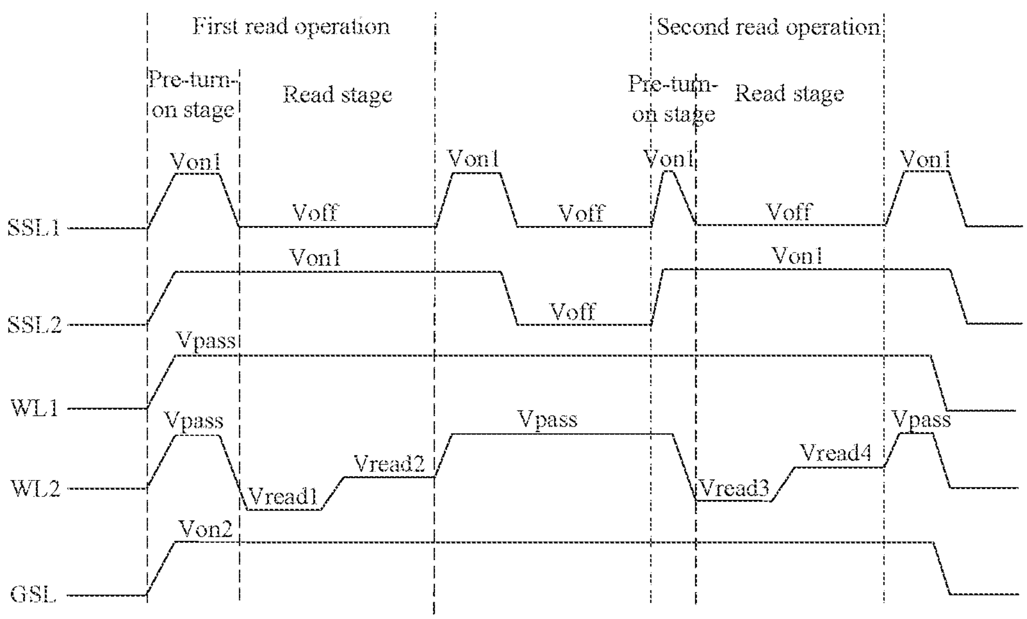
FIG. 11 is a schematic diagram of voltage waveform applied by a fourth optional read operation to word lines and select lines provided by examples of the present application.

In an example, as shown in FIG. 11, in the read stage of the first read operation, through the row decoder 430, the second read voltage (e.g., Vread1 and Vread2) is applied to the second word line (e.g., the word line WL2), and the pass voltage Vpass is applied to word lines (e.g., the word line WL1) of the plurality of word lines other than the second word line; the first turn-on voltage Von1 is applied to the second string select line (e.g., the string select line SSL2), and the turn-off voltage Voff is applied to string select lines (e.g., the string select line SSL1) of the plurality of string select lines other than the second string select line.

In the read stage of the second read operation, through the row decoder 430, the first read voltage (Vread3 and Vread4) is applied to the first word line (e.g., the word line WL2), and the pass voltage Vpass is applied to word lines (e.g., the word line WL1) of the plurality of word lines other than the first word line; the first turn-on voltage Von1 is applied to the first string select line (e.g., the string select line SSL2), and the turn-off voltage Voff is applied to string select lines (e.g., the string select line SSL1) of the plurality of string select lines other than the first string select line.

Figure 12:
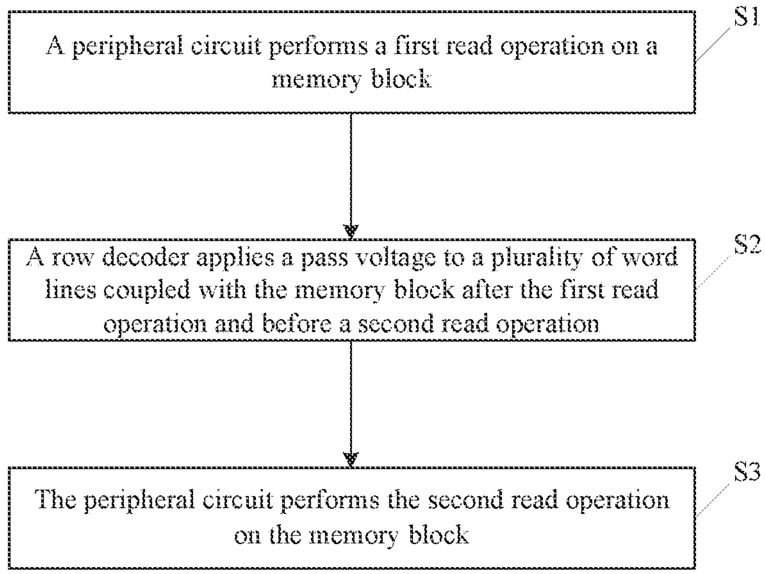
FIG. 12 is a flow diagram of an operation method of a memory provided by examples of the present application.

As shown in FIG. 12, examples of the present application provide an operation method of a memory, comprising operations S1-S3, as follows.

S1, A peripheral circuit performs a first read operation on a memory block.

Figure 13:
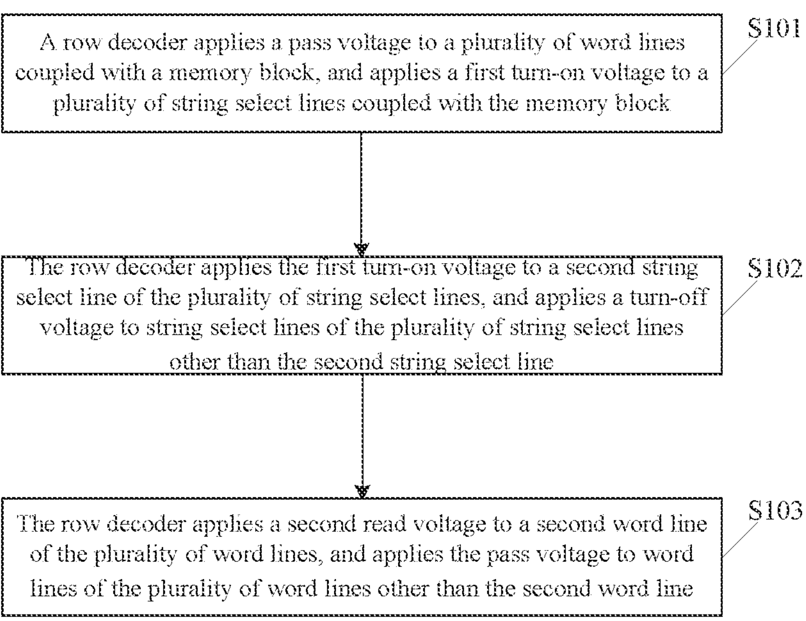
FIG. 13 is a flow diagram of operation S1 in an operation method provided by examples of the present application.

In an example, the peripheral circuit 400 may apply various voltages to a word line, a bit line and a select line, etc. of the memory block 100 to perform the first read operation. In some examples, the first read operation may be further divided into a pre-turn-on stage and a read stage. As shown in FIG. 13, the first read operation may comprise operations S101-S103, as follows.

S101, A row decoder applies a pass voltage to a plurality of word lines coupled with the memory block, and applies a first turn-on voltage to a plurality of string select lines coupled with the memory block.

In an example, operation S101 is the pre-turn-on stage of the first read operation. Through the row decoder 430, the pass voltage is applied to the plurality of word lines (i.e., including selected word lines and unselected word lines of the first read operation) of the memory block 100, the first turn-on voltage is applied to the plurality of string select lines (i.e., including a selected string select line and unselected string select lines of the first read operation) of the memory block 100, and a second turn-on voltage is applied to a ground select line of the memory block 100, thereby turning on a channel of a memory string 110.

S102, The row decoder applies the first turn-on voltage to a second string select line of the plurality of string select lines, and applies a turn-off voltage to string select lines of the plurality of string select lines other than the second string select line.

In an example, the second string select line is a selected string select line of the first read operation. Therefore, string select lines of the plurality of string select lines other than the second string select line are unselected string select lines of the first read operation. Pre-turn-on is controlled by the string select line or the ground select line. When the unselected string select line or the unselected ground select line is turned off, the pre-turn-on may be considered as being ended. That is to say, in other implementations, the second turn-on voltage may be also applied to the selected ground select line of the first read operation, and the turn-off voltage may be applied to the unselected ground select line of the first read operation to finish the pre-turn-on stage of the first read operation.

S103, The row decoder applies the second read voltage to a second word line of the plurality of word lines, and applies the pass voltage to word lines of the plurality of word lines other than the second word line.

In an example, operation S103 is the read stage of the first read operation, wherein the second word line is a selected word line of the first read operation, and therefore, word lines of the plurality of word lines other than the second word line are unselected word lines of the first read operation. In the read stage of the first read operation, a second read voltage is applied to the second word line through the row decoder 430, wherein the pass voltage is greater than the second read voltage. That is to say, the second word line is discharged from the pass voltage to the second read voltage through the row decoder 430. At this point, if the second read voltage is greater than a threshold voltage of a memory cell 113, a sensing node is discharged at a high discharging rate; and if the second read voltage is less than the threshold voltage of the memory cell 113, the sensing node is discharged at a low discharging rate. After a sensing duration Tsense, a page buffer 450 reads data by comparing magnitudes of the voltage Vso of the sensing node and the trip voltage Vtrip. For example, as described earlier, when the voltage Vso of the sensing node is greater than the trip voltage Vtrip, data "0" is read; and when the voltage Vso of the sensing node is less than the trip voltage Vtrip, data "1" is read.

S2, The row decoder applies a pass voltage to the plurality of word lines coupled with the memory block after the first read operation and before a second read operation.

In an example, after the first read operation, through the row decoder 430, the pass voltage is applied to the plurality of word lines, the first turn-on voltage is applied to the plurality of string select lines, and the second turn-on voltage is applied to the ground select line, such that the memory cell, a top select gate and a bottom select gate are turned on. An array common source and a bit line can pull out or neutralize residual electrons in a channel, such that charges in the channel of a memory string 110 are released from two ends of the channel, and the impact of residual electrons in the channel on the accuracy of subsequent read operations is reduced, thereby resetting a channel potential to a low potential. In examples of the present application, the low potential may be 0 V, and in other examples, the low potential may be also other voltage values. After channel reset, the turn-off voltage is applied to the plurality of string select lines through the row decoder 430, thereby turning off the channel of the memory string 110.

In some implementations, when the turn-off voltage is applied to the plurality of string select lines through the row decoder 430, the pass voltage is applied to the plurality of word lines through the row decoder 430, and the second turn-on voltage is applied to the ground select line to turn on the memory cell and the bottom select gate in the memory string 110. Therefore, the channel potential is reset to a low potential of a better state (to pull out or neutralize the residual electrons in the channel through the array common source). Therefore, during a next read operation, the time of the pre-turn-on stage is shortened, thereby shortening the read time of the read operation.

S3, The peripheral circuit performs the second read operation on the memory block.

Figure 14:
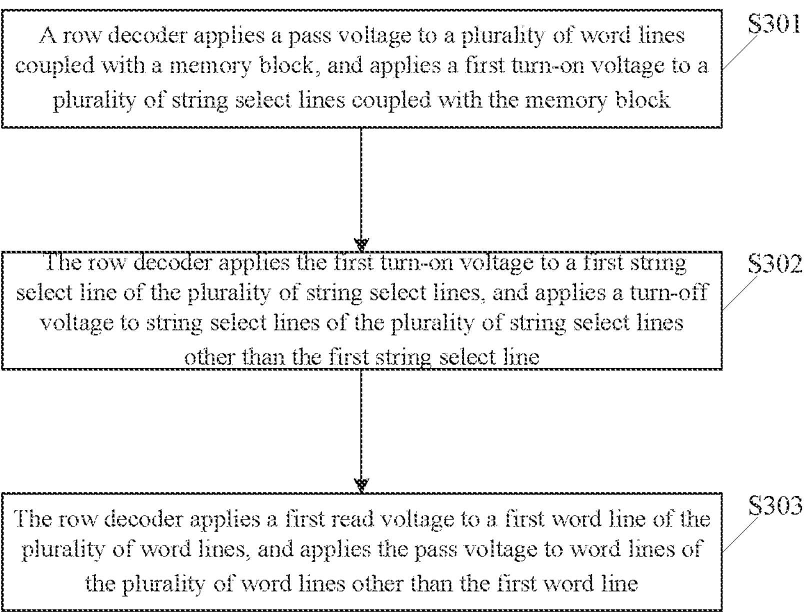
FIG. 14 is a flow diagram of operation S3 in an operation method provided by examples of the present application.

In some examples, the second read operation may be further divided into a pre-turn-on stage and a read stage. As shown in FIG. 14, the peripheral circuit 400 performs the second read operation on the memory block 100, which may comprise operations S301-S303, as follows:

S301, The row decoder applies the pass voltage to the plurality of word lines coupled with the memory block, and applies the first turn-on voltage to the plurality of string select lines coupled with the memory block.

In an example, operation S301 is the pre-turn-on stage of the second read operation, wherein through the row decoder 430, the pass voltage is applied to the plurality of word lines of the memory block 100, the first turn-on voltage is applied to the plurality of string select lines, and the second turn-on voltage is applied to the ground select line, such that the channel of the memory string 110 is turned on.

After the first read operation and before the second read operation, the row decoder 430 has applied the pass voltage to the plurality of word lines of the memory block 100. Therefore, in the pre-turn-on stage of the second read operation, the string select line is only required to be selected to be charged through the row decoder 430, without charging the word line. In the case of limited supply power, only charging the string select line can make the voltage of the string select line reach the first turn-on voltage quickly, thereby saving the charging time and further shortening the read time of the second read operation.

S302, The row decoder applies the first turn-on voltage to a first string select line of the plurality of string select lines, and applies the turn-off voltage to string select lines of the plurality of string select lines other than the first string select line.

In an example, the first string select line is a selected string select line of the second read operation. Therefore, string select lines of the plurality of string select lines other than the first string select line are unselected string select lines of the second read operation. In other implementations, the second turn-on voltage may be also applied to the selected ground select line of the second read operation, and the turn-off voltage may be applied to the unselected ground select line of the second read operation to finish the pre-turn-on stage of the second read operation.

S303, The row decoder applies the first read voltage to a first word line of the plurality of word lines, and applies the pass voltage to word lines of the plurality of word lines other than the first word line.

In an example, operation S303 is the read stage of the second read operation, wherein the first word line is a selected word line of the second read operation, and therefore, word lines of the plurality of word lines other than the first word line are unselected word lines of the second read operation. In the read stage of the second read operation, the first read voltage is applied to the first word line through the row decoder 430, wherein the pass voltage is greater than the first read voltage. If the first read voltage is greater than the threshold voltage of the memory cell 113, the sensing node is discharged at a high discharging rate; and if the first read voltage is less than the threshold voltage of the memory cell 113, the sensing node is discharged at a low discharging rate. After the sensing duration Tsense, the page buffer 450 reads data by comparing magnitudes of the voltage Vso of the sensing node and the trip voltage Vtrip.

It should be understood that the selected word lines of the first read operation and the second read operation may be the same word line, or different word lines; likewise, the selected string select lines of the first read operation and the second read operation may be the same string select line or different string select lines. Since the examples of the present application are not improved in the read stage of the read operation, the above examples should not be understood as limitations of the present application.

Examples of the present application provide an operation method of a memory, a memory and a memory system. The memory comprises a memory block and a plurality of word lines coupled to the memory block. In the present application, after a first read operation and before a second read operation, a pass voltage is applied to the plurality of word lines; in a pre-turn-on stage of the second read operation, the pass voltage is applied to the plurality of word lines; and in a read stage of the second read operation, a first read voltage is applied to a first word line of the plurality of word lines, wherein the pass voltage is greater than the first read voltage. Therefore, in the pre-turn-on stage of the second read operation, only a string select line is charged, such that a voltage of the string select line reaches a first turn-on voltage quickly, thereby saving the charging time, shortening the read time of the second read operation and increasing the read speed of the memory.

Examples of the present application provide a computer readable storage medium which stores computer executable instructions which, when being executed, can implement the method of FIGS. 12-14.

Examples of the present application provide a computer apparatus comprising a processor and a readable storage medium coupled with the processor, wherein the readable storage medium stores executable instructions which, when being executed by the processor, can implement the method of FIGS. 12-14.

Examples disclosed by the present application provide an operation method of a memory, a memory and a memory system for increasing a read speed of the memory.

In order to achieve the above objective, the examples of the present application employ the following technical solution:

In a first aspect, an operation method of a memory is provided. The memory comprises a memory block and a plurality of word lines coupled to the memory block. The operation method comprises: applying a pass voltage to the plurality of word lines after a first read operation and before a second read operation; applying the pass voltage to the plurality of word lines in a pre-turn-on stage of the second read operation; and applying a first read voltage to a first word line of the plurality of word lines in a read stage of the second read operation, wherein the pass voltage is greater than the first read voltage.

In the present application, after the first read operation and before the second read operation, the pass voltage is applied to the plurality of word lines of the memory block, the plurality of word lines are not discharged, and a voltage of the plurality of word lines is maintained as the pass voltage, such that in the pre-turn-on stage of the second read operation, only string select lines are required to be charged, and the plurality of word lines are not required to be charged. Moreover, in the read stage of the second read operation, the first read voltage is applied to the first word line of the plurality of word lines to read data in one memory page. In the case of limited supply power, since the plurality of word lines are not discharged, only the string select lines are charged, and a voltage of the string select lines may reach the first turn-on voltage quickly, such that the charging time of the pre-turn-on stage of the second read operation (and subsequent read operations) is saved so as to shorten the read time of the second read operation (and the subsequent read operations), thereby increasing a read speed of the memory.

In some examples, the operation method further comprises: applying the pass voltage to word lines of the plurality of word lines other than the first word line in the read stage of the second read operation. In the read stage of the second read operation, the first read voltage is only applied to the first word line, and the pass voltage is applied to the word lines other than the first word line, which ensures that a discharging rate of a sensing node is related to a memory cell coupled with the first word line.

In some examples, the operation method further comprises: applying the first turn-on voltage to the plurality of string select lines coupled with the memory block in the pre-turn-on stage of the second read operation; and applying the first turn-on voltage to a first string select line of the plurality of string select lines in the read stage of the second read operation. Therefore, the sensing node is discharged through a memory string coupled with the first string select line.

In some examples, the operation method further comprises: applying a turn-off voltage to string select lines of the plurality of string select lines other than the first string select line in the read stage of the second read operation, which ensures that the sensing node can be only discharged through the memory string coupled with the first string select line.

In some examples, the operation method comprises: applying the pass voltage to the plurality of word lines in a pre-turn-on stage of the first read operation; and applying a second read voltage to a second word line of the plurality of word lines in a read stage of the first read operation, wherein the pass voltage is greater than the second read voltage. Therefore, data in another memory page is read through the first read operation.

In some examples, the operation method further comprises: applying the pass voltage to word lines of the plurality of word lines other than the second word line in the read stage of the first read operation, which ensures that the discharging rate of the sensing node is related to a memory cell coupled with the second word line.

In some examples, the operation method further comprises: applying the first turn-on voltage to the plurality of string select lines coupled with the memory block in the pre-turn-on stage of the first read operation; and applying the first turn-on voltage to a second string select line of the plurality of string select lines in the read stage of the first read operation. Therefore, the sensing node is discharged through a memory string coupled with the second string select line.

In some examples, the operation method further comprises: applying the turn-off voltage to string select lines of the plurality of string select lines other than the second string select line in the read stage of the first read operation, which ensures that the sensing node can be only discharged through the memory string coupled with the second string select line.

In some examples, the operation method further comprises: first applying the first turn-on voltage to the plurality of string select lines coupled with the memory block, and then applying the turn-off voltage to the plurality of string select lines, after the first read operation and before the second read operation. Therefore, a potential of a memory string channel is restored to a low potential, thereby reducing the impact of residual electrons in the channel on the accuracy of subsequent read operations.

In some examples, the operation method further comprises: applying a second turn-on voltage to a ground select line coupled with the memory block after the first read operation and before the second read operation. Therefore, the potential of the memory string channel is reset to a low potential of a better state (to better pull out or neutralize the residual electrons in the channel), and during the next read operation (the second read operation), the time of waiting for channel reset in the pre-turn-on stage may become shorter, thereby further shortening the read time of the second read operation.

In some examples, the operation method further comprises: applying the second turn-on voltage to the ground select line during the first read operation and the second read operation, which ensures that the sensing node can be discharged through an array common source coupled with a top select gate.

In a second aspect, a memory is provided. The memory comprises a memory array and a peripheral circuit. The memory array comprises a plurality of memory blocks and a plurality of word lines coupled to the memory blocks. The peripheral circuit is coupled to the plurality of word lines, and is configured to apply a pass voltage to the plurality of word lines after a first read operation and before a second read operation; apply the pass voltage to the plurality of word lines in a pre-turn-on stage of the second read operation; and apply a first read voltage to a first word line of the plurality of word lines in a read stage of the second read operation, wherein the pass voltage is greater than the first read voltage.

In some examples, the peripheral circuit is further configured to apply the pass voltage to word lines of the plurality of word lines other than the first word line in the read stage of the second read operation.

In some examples, the peripheral circuit is further configured to apply the first turn-on voltage to the plurality of string select lines coupled with the memory block in the pre-turn-on stage of the second read operation; and apply the first turn-on voltage to a first string select line of the plurality of string select lines in the read stage of the second read operation.

In some examples, the peripheral circuit is further configured to apply a turn-off voltage to string select lines of the plurality of string select lines other than the first string select line in the read stage of the second read operation.

In some examples, the peripheral circuit is configured to apply the pass voltage to the plurality of word lines in a pre-turn-on stage of the first read operation; and apply a second read voltage to a second word line of the plurality of word lines in a read stage of the first read operation, wherein the pass voltage is greater than the second read voltage.

In some examples, the peripheral circuit is further configured to apply the pass voltage to word lines of the plurality of word lines other than the second word line in the read stage of the first read operation.

In some examples, the peripheral circuit is further configured to apply the first turn-on voltage to the plurality of string select lines coupled with the memory block in the pre-turn-on stage of the first read operation; and apply the first turn-on voltage to a second string select line of the plurality of string select lines in the read stage of the first read operation.

In some examples, the peripheral circuit is further configured to apply the turn-off voltage to string select lines of the plurality of string select lines other than the second string select line in the read stage of the first read operation.

In some examples, the peripheral circuit is configured to first apply the first turn-on voltage to the plurality of string select lines coupled with the memory block, and then apply the turn-off voltage to the plurality of string select lines, after the first read operation and before the second read operation.

In some examples, the peripheral circuit is further configured to apply a second turn-on voltage to a ground select line coupled with the memory block after the first read operation and before the second read operation.

In some examples, the peripheral circuit is further configured to apply the second turn-on voltage to the ground select line during the first read operation and the second read operation.

In a third aspect, a memory system is provided, which comprises a memory controller, and a memory in the above second aspect, wherein the memory controller is configured to control the memory.

In a fourth aspect, a computer readable storage medium is provided, which stores computer executable instructions which, when being executed, can implement a method of any example in the above first aspect.

In a fifth aspect, a computer apparatus is provided, which comprises a processor, and a readable storage medium coupled with the processor, wherein the readable storage medium stores executable instructions which, when being executed by the processor, can implement a method of any example in the above first aspect.

It may be understood that the technical effect of the second aspect to the fifth aspect may be referred to that of the first aspect or any implementation thereof, which is no longer repeated here.

It can clearly understand by those skilled in the art that, for ease and simplicity of description, in the above examples, the descriptions of various examples have their own emphases, and the portions of some example that are not described in detail may be referred to a corresponding process in the aforementioned method examples, which is no longer repeated here.

In several examples provided by the present application, it should be understood that, the operation method, the memory and the memory system provided may be achieved by other means. For example, the division of some module is only a logical functional division. There may be other division methods in actual implementation. For example, a plurality of units or components may be combined, or may be integrated into another system, or some features can be omitted or not performed.

Those of ordinary skill in the art can recognize that the modules and algorithm steps of various examples as described in conjunction with the examples disclosed herein can be implemented in an electronic hardware, or a combination of a computer software and an electronic hardware. Whether these functions are performed by means of a hardware or a software depends on particular applications and design constraints of the technical solution. Those skilled in the art can implement the described function using different methods for each particular application, but such implementation should not be considered to be beyond the scope of the present application.

The above descriptions are merely particular implementations of the present disclosure, and the protection scope of the present disclosure is not limited to those. Any variation or replacement that may be readily figured out by those skilled in the art within the technical scope disclosed by the present disclosure shall be encompassed within the protection scope of the present disclosure. Therefore, the scope of protection of the present disclosure should be defined by the scope of protection of the claims.

What is claimed is:

1. An operation method of a memory, wherein the memory comprises a memory block and a plurality of word lines and a plurality of string select lines coupled to the memory block, and the operation method comprises:

after a first read operation, wherein a first turn-on voltage is applied to a second string select line of the plurality of string select lines, and before a second read operation:

applying a pass voltage to the plurality of word lines; and applying the first turn-on voltage to the plurality of string select lines other than the second string select line while continuing the applying of the first turn-on voltage to the second string select line followed by applying a turn-off voltage to each of the plurality of string select lines;

applying the pass voltage to the plurality of word lines in a pre-turn-on stage of the second read operation; and applying a first read voltage to a first word line of the plurality of word lines in a read stage of the second read operation, wherein the pass voltage is greater than the first read voltage.

2. The operation method of claim 1, further comprising applying the pass voltage to word lines of the plurality of word lines other than the first word line in the read stage of the second read operation.

3. The operation method of claim 1, further comprising:

applying the first turn-on voltage to the plurality of string select lines coupled with the memory block in the pre-turn-on stage of the second read operation; and applying the first turn-on voltage to a first string select line of the plurality of string select lines in the read stage of the second read operation.

4. The operation method of claim 3, further comprising applying the turn-off voltage to string select lines of the plurality of string select lines other than the first string select line in the read stage of the second read operation.

5. The operation method of claim 1, comprising:

applying the pass voltage to the plurality of word lines in a pre-turn-on stage of the first read operation; and applying a second read voltage to a second word line of the plurality of word lines in a read stage of the first read operation, wherein the pass voltage is greater than the second read voltage.

6. The operation method of claim 5, further comprising applying the pass voltage to word lines of the plurality of word lines other than the second word line in the read stage of the first read operation.

7. The operation method of claim 1, further comprising:

applying the first turn-on voltage to the plurality of string select lines coupled with the memory block in a pre-turn-on stage of the first read operation; and applying the first turn-on voltage to the second string select line of the plurality of string select lines in a read stage of the first read operation.

8. The operation method of claim 7, further comprising applying the turn-off voltage to string select lines of the plurality of string select lines other than the second string select line in the read stage of the first read operation.

9. The operation method of claim 1, further comprising applying a second turn-on voltage to a ground select line coupled with the memory block after the first read operation and before the second read operation.

10. The operation method of claim 9, further comprising applying the second turn-on voltage to the ground select line during the first read operation and the second read operation.

11. A memory, comprising:

a memory array comprising a plurality of memory blocks and a plurality of word lines and a plurality of string select lines coupled to the plurality of memory blocks; and a peripheral circuit coupled to the plurality of word lines, and configured to:

after a first read operation, wherein a first turn-on voltage is applied to a second string select line of the plurality of string select lines, and before a second read operation:

apply a pass voltage to the plurality of word lines; and apply the first turn-on voltage to the plurality of string select lines other than the second string select line while continuing the applying of the first turn-on voltage to the second string select line followed by applying a turn-off voltage to each of the plurality of string select lines;

apply the pass voltage to the plurality of word lines in a pre-turn-on stage of the second read operation; and apply a first read voltage to a first word line of the plurality of word lines in a read stage of the second read operation, wherein the pass voltage is greater than the first read voltage.

12. The memory of claim 11, wherein the peripheral circuit is further configured to apply the pass voltage to word lines of the plurality of word lines other than the first word line in the read stage of the second read operation.

13. The memory of claim 11, wherein the peripheral circuit is further configured to:

apply the first turn-on voltage to the plurality of string select lines coupled with the memory block in the pre-turn-on stage of the second read operation; and apply the first turn-on voltage to a first string select line of the plurality of string select lines in the read stage of the second read operation.

14. The memory of claim 13, wherein the peripheral circuit is further configured to apply the turn-off voltage to string select lines of the plurality of string select lines other than the first string select line in the read stage of the second read operation.

15. The memory of claim 11, wherein the peripheral circuit is further configured to:

apply the pass voltage to the plurality of word lines in a pre-turn-on stage of the first read operation; and apply a second read voltage to a second word line of the plurality of word lines in a read stage of the first read operation, wherein the pass voltage is greater than the second read voltage.

16. The memory of claim 15, wherein the peripheral circuit is further configured to apply the pass voltage to word lines of the plurality of word lines other than the second word line in the read stage of the first read operation.

17. The memory of claim 11, wherein the peripheral circuit is further configured to:

apply the first turn-on voltage to the plurality of string select lines coupled with the memory block in a pre-turn-on stage of the first read operation; and apply the first turn-on voltage to the second string select line of the plurality of string select lines in a read stage of the first read operation.

18. A memory system, comprising:

a memory, comprising:

a memory array comprising a plurality of memory blocks and a plurality of word lines and a plurality of string select lines coupled to the memory blocks; and a peripheral circuit coupled to the plurality of word lines and to the plurality of string select lines, and configured to:

after a first read operation, wherein a first turn-on voltage is applied to a second string select line of the plurality of string select lines, and before a second read operation:

apply a pass voltage to the plurality of word lines; and apply the first turn-on voltage to the plurality of string select lines other than the second string select line while continuing the applying of the first turn-on voltage to the second string select line followed by applying a turn-off voltage to each of the plurality of string select lines;

apply the pass voltage to the plurality of word lines in a pre-turn-on stage of the second read operation; and apply a first read voltage to a first word line of the plurality of word lines in a read stage of the second read operation, wherein the pass voltage is greater than the first read voltage, and a memory controller configured to control the memory.

* * * * *